United States Patent
Honma

(10) Patent No.: US 8,854,878 B2
(45) Date of Patent: Oct. 7, 2014

(54) NONVOLATILE SEMICONDUCTOR MEMORY DEVICE

(75) Inventor: Mitsuaki Honma, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 101 days.

(21) Appl. No.: 13/603,842

(22) Filed: Sep. 5, 2012

(65) Prior Publication Data

US 2013/0235657 A1    Sep. 12, 2013

(30) Foreign Application Priority Data

Dec. 9, 2011   (JP) .................................. 2011-270386

(51) Int. Cl.
| | | |
|---|---|---|
| *G11C 16/04* | (2006.01) | |
| *G11C 11/56* | (2006.01) | |
| *G11C 16/34* | (2006.01) | |
| *G11C 16/10* | (2006.01) | |

(52) U.S. Cl.
CPC ........ *G11C 16/3427* (2013.01); *G11C 16/0483* (2013.01); *G11C 11/5628* (2013.01); *G11C 16/3459* (2013.01); *G11C 16/10* (2013.01)
USPC ............ 365/185.02; 365/185.13; 365/185.18; 365/185.21; 365/185.22; 365/185.24

(58) Field of Classification Search
CPC .......... G11C 16/3418; G11C 16/0483; G11C 16/10; G11C 16/3427; G11C 11/5628; G11C 7/18; G11C 16/08; G11C 16/30; G11C 16/12; G11C 16/28; G11C 16/26; G11C 11/5642; G11C 7/062; G11C 16/3454; G11C 16/3459; G11C 2211/5621; H01L 27/115
USPC ............. 365/185.02, 185.13, 185.18, 185.21, 365/185.22, 185.24
See application file for complete search history.

(56) References Cited

U.S. PATENT DOCUMENTS

| | | | |
|---|---|---|---|
| 7,027,329 B2 | 4/2006 | Sakuma et al. | |
| 7,864,591 B2 | 1/2011 | Tanaka et al. | |
| 2010/0124109 A1 | 5/2010 | Honma et al. | |
| 2011/0080789 A1* | 4/2011 | Kalavade et al. | ........ 365/185.19 |
| 2011/0107014 A1 | 5/2011 | Ruby et al. | |
| 2011/0158000 A1* | 6/2011 | Cho et al. | .................. 365/185.22 |
| 2013/0010537 A1* | 1/2013 | Kawai et al. | ............. 365/185.03 |

FOREIGN PATENT DOCUMENTS

| | | |
|---|---|---|
| JP | 2003-196988 | 7/2003 |
| JP | 2009-545092 | 12/2009 |
| JP | 2009-545093 | 12/2009 |
| JP | 2010-27165 | 2/2010 |
| WO | WO 2008/011439 A2 | 1/2008 |

OTHER PUBLICATIONS

Japanese Office Action issued Jul. 22, 2014 in corresponding Japanese Patent Application No. 2011-270386 (with English Translation, (7 pages).

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array and a controller. The controller is configured to perform a verify operation using a first verification voltage and a second verification voltage (first verification voltage<second verification voltage) when first value data is stored in a first memory cell. The controller is configured to determine whether a write operation to the first memory cell is completed or continued based on write data of a second memory cell adjacent to the first memory cell when a threshold voltage of the first memory cell is greater than or equal to the first verification voltage and less than the second verification voltage.

16 Claims, 10 Drawing Sheets

Figure 1:
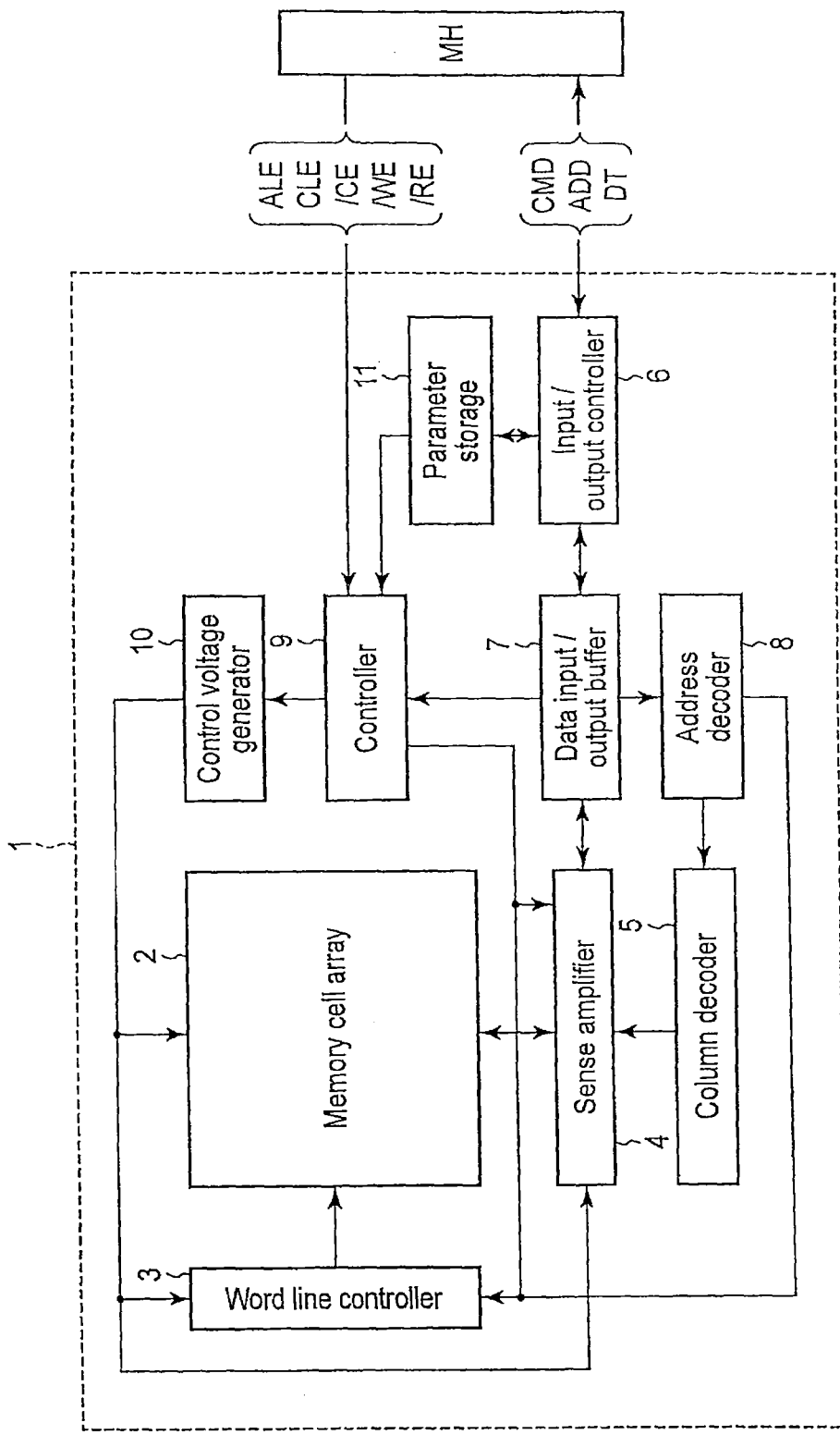

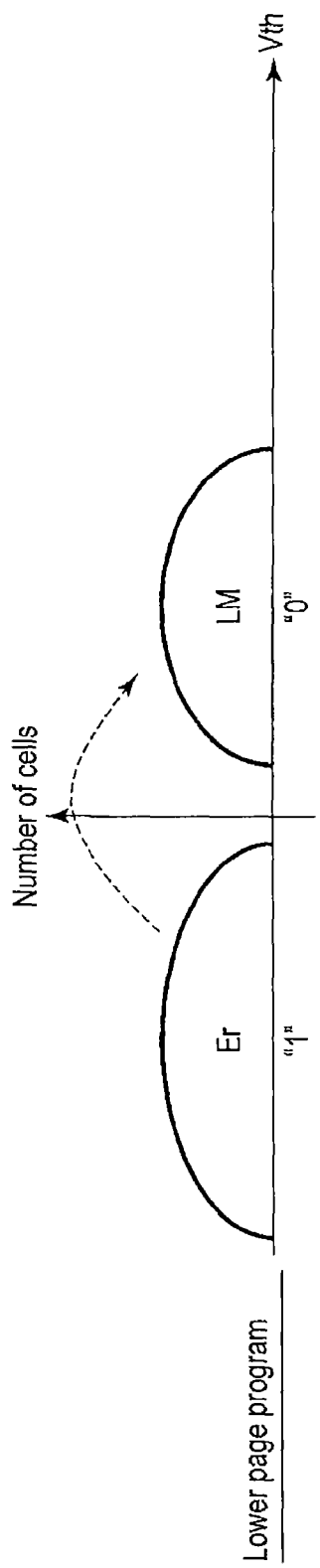
F I G. 5A
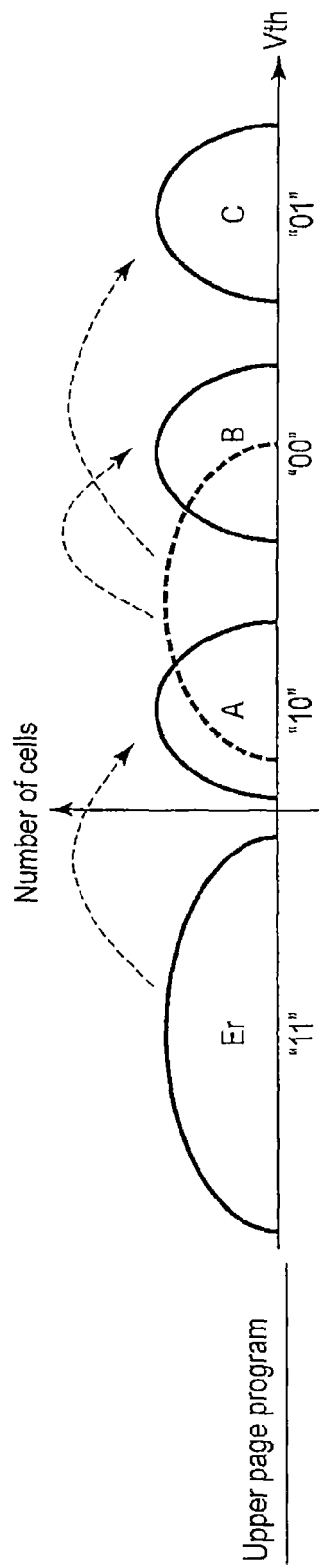
F I G. 5B

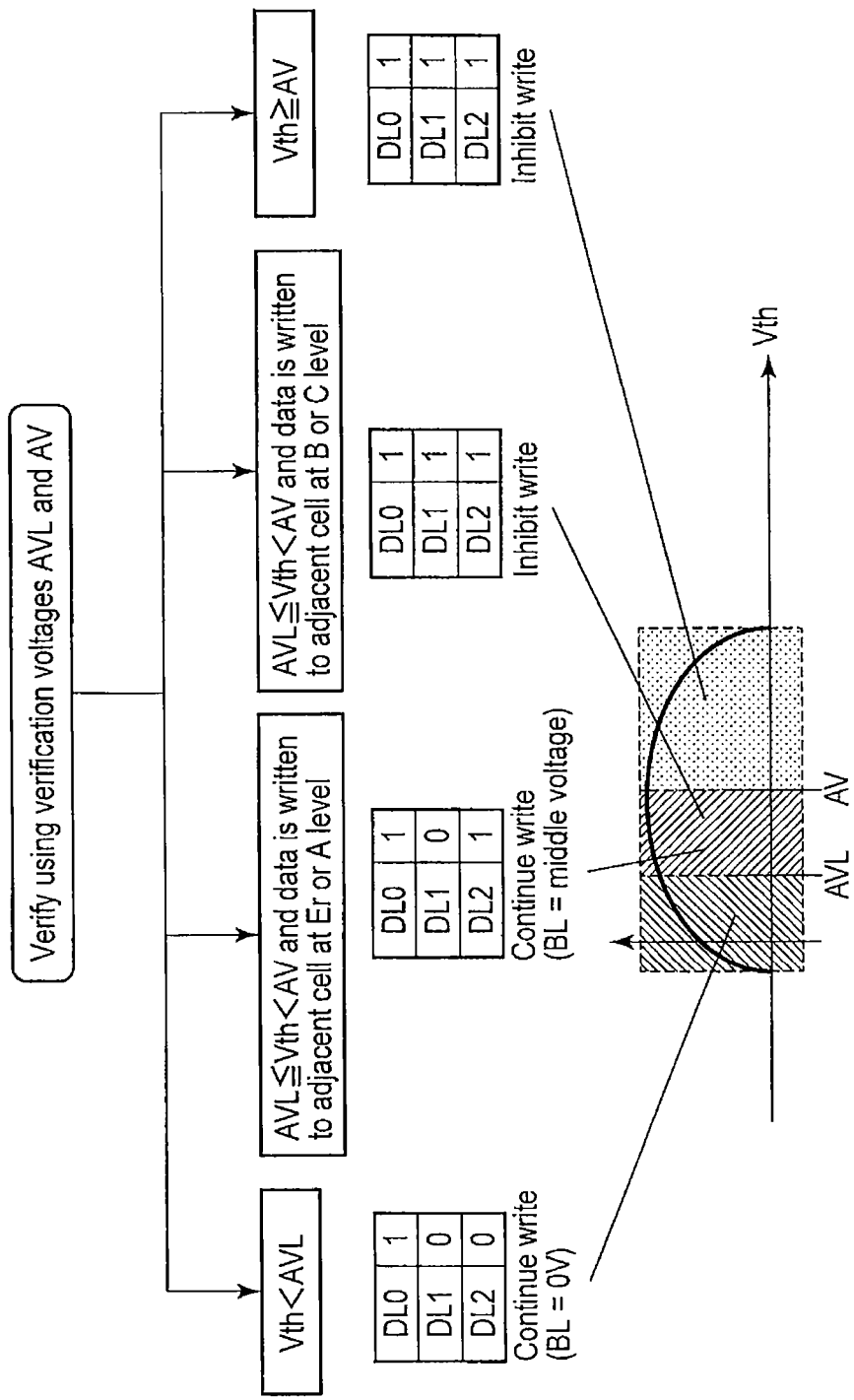
F I G. 11

NONVOLATILE SEMICONDUCTOR MEMORY DEVICE

CROSS-REFERENCE TO RELATED APPLICATIONS

This application is based upon and claims the benefit of priority from Japanese Patent Application No. 2011-270386, filed Dec. 9, 2011, the entire contents of which are incorporated herein by reference.

FIELD

Embodiments described herein relate generally to a nonvolatile semiconductor memory device.

BACKGROUND

A NAND flash memory is well known as a kind of an electrically rewritable nonvolatile semiconductor memory device. A multi-level cell (MLC) storage system in which a threshold distribution of a memory cell is segmented to be able to store plural bits in the memory cell is used as a technology of increasing the storage capacity of the NAND flash memory.

In the memory cell of the NAND flash memory, a write voltage is applied to a control gate of the memory cell, and electrons are injected in a charge storage layer using a potential difference between the control gate and a substrate, thereby writing data. Because of the circuit configuration of the NAND flash memory, the write operation is performed as a unit of all the memory cells connected to one word line.

When the electrons are injected in the charge storage layer of the memory cell, sometimes a threshold voltage of an adjacent memory cell in which the data is already written is shifted by the influence of capacitive coupling. Additionally, a shift amount of the threshold voltage varies according to a data pattern of the adjacent memory cell due to the shrinking of the memory cell, which affects the threshold distribution. Therefore, sometimes the data of the memory cell is incorrectly read, namely, a frequency of erroneous read is increased to degrade the reliability of the NAND flash memory.

BRIEF DESCRIPTION OF THE DRAWINGS

FIG. 1 is a block diagram illustrating a configuration of a nonvolatile semiconductor memory device according to a first embodiment;

FIG. 2 is a circuit diagram illustrating configurations of a memory cell array and a sense amplifier in FIG. 1;

FIG. 3 is a circuit diagram illustrating an example of a sense amplifier unit (SAU);

FIG. 4 is a circuit diagram illustrating an example of a data control unit (DCU);

FIGS. 5A and 5B are views illustrating a relationship between a threshold voltage of a memory cell and data;

FIGS. 6A and 6B are schematic diagrams illustrating an example of a write operation;

FIGS. 7A and 7B are schematic diagrams illustrating the write operation of the first embodiment;

FIG. 8 is a view illustrating a data allocation of a data latch circuit;

FIG. 9 is a view illustrating data states of the data latch circuits relating to an attention cell and adjacent cells;

FIG. 10 is a flowchart illustrating the write operation of the first embodiment;

FIG. 11 is a view illustrating a relationship between the threshold voltage of the memory cell and the data of the data latch circuit after A-level write verification;

FIG. 12 is a view illustrating the data states of the data latch circuits relating to the attention cell and the adjacent cells; and FIG. 13 is a flowchart illustrating a write operation according to a second embodiment.

DETAILED DESCRIPTION

In general, according to one embodiment, there is provided a nonvolatile semiconductor memory device comprising:

a memory cell array connected to word lines and bit lines, and including memory cells each of which is capable of storing n values (n is a natural number of 3 or more); and a controller configured to control voltages at a word line and a bit line according to write data, and to perform a write operation to write data to the memory cell and a verify operation to verify a threshold voltage of the memory cell, wherein the controller is configured to perform a verify operation using a first verification voltage and a second verification voltage (first verification voltage<second verification voltage) when first value data is stored in a first memory cell, and the controller is configured to determine whether a write operation to the first memory cell is completed or continued based on write data of a second memory cell adjacent to the first memory cell when a threshold voltage of the first memory cell is greater than or equal to the first verification voltage and less than the second verification voltage.

The embodiments will be described hereinafter with reference to the accompanying drawings. In the description which follows, the same or functionally equivalent elements are denoted by the same reference numerals, to thereby simplify the description.

[First Embodiment]

[1. Configuration of Nonvolatile semiconductor memory device]

FIG. 1 is a block diagram illustrating a configuration of a nonvolatile semiconductor memory device 1 according to a first embodiment. In the first embodiment, a NAND flash memory will be described as the nonvolatile semiconductor memory device 1 by way of example.

Referring to FIG. 1, a memory cell array 2 is configured such that plural memory cells are two-dimensionally arrayed. A memory cell is constructed by an electrically rewritable EEPROM cell. Plural bit lines, plural word lines, and a source line are provided in the memory cell array 2 in order to control a voltage at the memory cell.

A word line controller 3 that is of a row decoder is connected to the word lines to select and drive the word line when reading, writing, and erasing. A sense amplifier 4 is connected to the bit lines to control the voltage on the bit line when reading, writing, and erasing. The sense amplifier 4 senses the voltage on the bit line when reading, and applies a voltage to the bit line when writing. A column decoder 5 generates a column select signal selecting the bit line in response to an output signal of an address decoder 8, and the column decoder 5 sends the column select signal to the sense amplifier 4.

An input/output controller 6 receives various commands CMD, an address signal ADD, and data DT (including write data), which are supplied from the outside. In writing data, write data is sent from the input/output controller 6 to the sense amplifier 4 through a data input/output buffer 7. In reading data, read data read from the sense amplifier 4 is sent to the input/output controller 6 through the data input/output buffer 7, and output from the input/output controller 6 to an external HM (for example, a memory controller or a host).

The address signal ADD sent from the input/output controller 6 to the data input/output buffer 7 is sent to the address decoder 8. The address decoder 8 decodes the address signal ADD, sends a row address to the word line controller 3, and sends a column address to the column decoder 5.

The command CMD sent from the input/output controller 6 to the data input/output buffer 7 is sent to a controller 9. External control signals, such as a chip enable signal /CE, a write enable signal /WE, a read enable signal /RE, an address latch enable signal ALE, and a command latch enable signal CLE, are supplied from the external HM to the controller 9. Based on the external control signal and the command CMD, which are supplied depending on an operating mode, the controller 9 generates a control signal controlling write and erase sequences and a control signal controlling read. The control signals are sent to the word line controller 3, the sense amplifier 4, and a control voltage generator 10. The controller 9 wholly controls various operations of the nonvolatile semiconductor memory device 1 using the control signals. The controller 9 is not necessary disposed in the nonvolatile semiconductor memory device 1. That is, the controller 9 may be disposed in a different semiconductor device from the nonvolatile semiconductor memory device 1, or the controller 9 may be disposed in the external HM.

In response to various control signals sent from the controller 9, the control voltage generator 10 generates voltages, such as a read voltage, a write voltage, a verification voltage, and an erase voltage, which are necessary for various operations of the memory cell array 2, the word line controller 3, and the sense amplifier 4.

A parameter storage 11 is connected to the input/output controller 6 and the controller 9, and a parameter suitable for chip quality determined in a test process is stored in the parameter storage 11.

Figure 2:
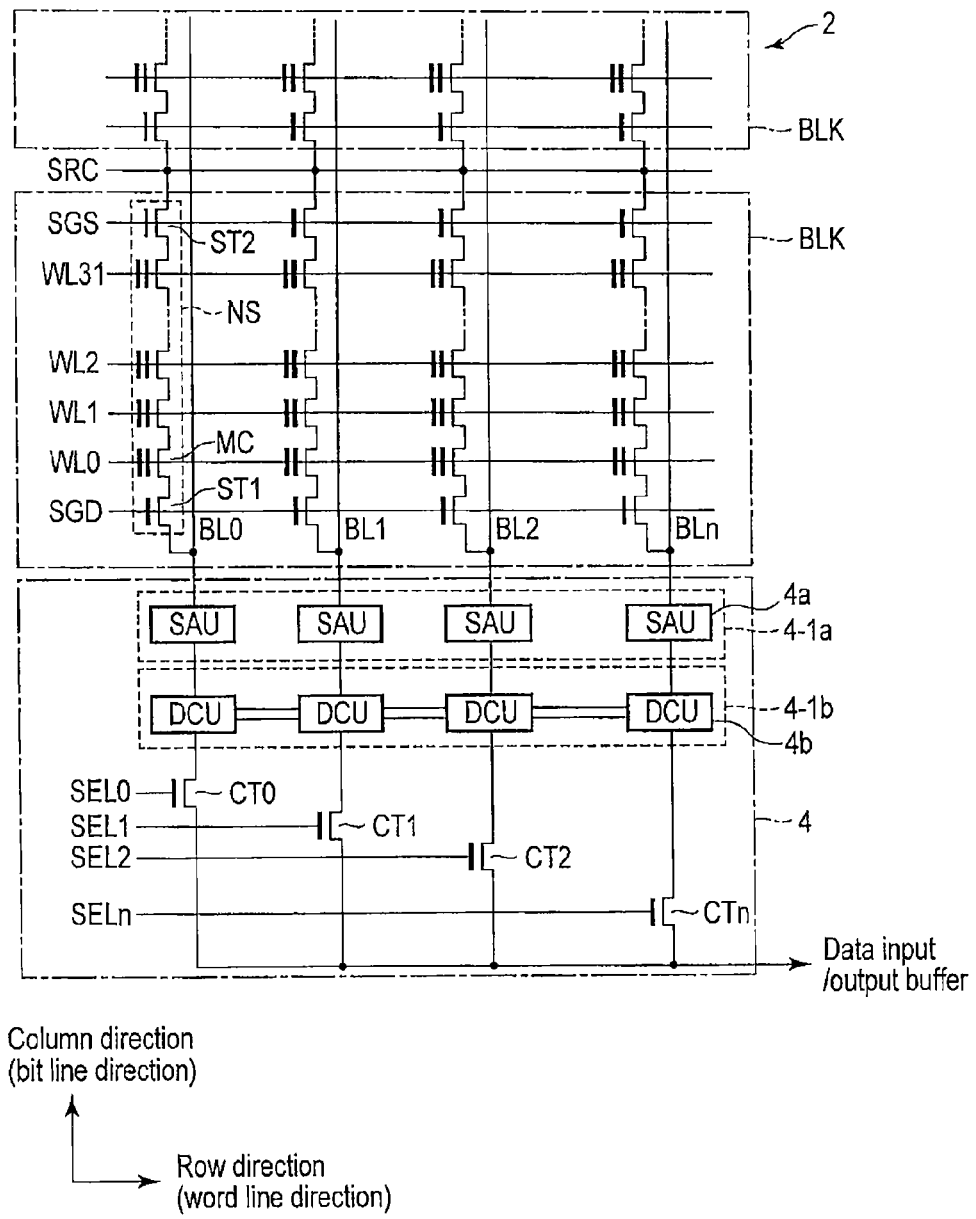

FIG. 2 is a circuit diagram illustrating configurations of the memory cell array 2 and the sense amplifier 4 in FIG. 1. The memory cell array 2 includes plural blocks BLK. Each block BLK is a unit of data erase. Each block BLK includes plural NAND strings NS. Each NAND string NS includes plural memory cells MC (also referred to as memory cell transistors) and two select gate transistors ST1 and ST2. By way of example, FIG. 2 illustrates an example in which the NAND string NS includes 32 memory cells MC. For example, an N-channel metal oxide semiconductor field effect transistor (MOSFET) is used as the select gate transistors ST1 and ST2.

The memory cell MC has a stacked gate structure including a charge storage layer (for example, a floating gate electrode, an insulating film having a trap, or a stacked film thereof) that is formed on a semiconductor substrate (well) with a gate insulating film is interposed therebetween and a control gate electrode that is formed on the charge storage layer with an inter-gate insulating film interposed therebetween. For example, data of plural bits (or at least three values) can be stored in one memory cell MC according to a change in threshold voltage caused by the number of electrons injected in the charge storage layer.

Current paths of the memory cells MC adjacent to each other in the NAND string NS are connected in series. One end of the series-connected memory cells MC is connected to a source of the select gate transistor ST1, and the other end is connected to a drain of the select gate transistor ST2.

The control gate electrodes of the memory cells MC located in the same row are commonly connected to one word line WL. Gate electrodes of the select gate transistors ST1 (or ST2) located in the same row are commonly connected to a select gate line SGD (or SGS). The drain of the select gate transistor ST1 is connected to a bit line BL. The source of the select gate transistor ST2 is connected to a source line SRC.

The memory cells MC connected to the same word line WL constitute a page. The write or read is collectively performed on the memory cells MC in one page. The memory cell array 2 is configured such that the pieces of the plural pages are collectively erased, and the block BLK is a unit of the erase.

In the bit line BL, the drains of the select gate transistors ST1 are commonly connected between the blocks BLK. That is, the NAND strings NS located in the same column in the blocks BLK are connected to the same bit line BL.

The sense amplifier 4 includes plural sense amplifier units (SAU) 4a and plural data control units (DCU) 4b. The sense amplifier units 4a are connected to plural bit lines BL0 to BLn, respectively. The data control units 4b are connected to the corresponding sense amplifier units 4a. The sense amplifier units 4a constitute one sense amplifier unit group 4-1a, and the data control units 4b constitute one data control unit group 4-1b. In reading data, each sense amplifier unit 4a senses and holds data, which is read from the memory cell to the bit line. The data control units 4b are connected to the data input/output buffer 7 through column select transistors CT0 to CTn that operate in response to column select signals SEL0 to SELn.

Any data control unit 4b is connected to an adjacent data control unit in a row direction, and configured to be able to send and receive the data to and from the data control unit adjacent to the data control unit 4b. The data control units adjacent to each other in the row direction are connected by two signal lines, one of the signal lines is used to send the data from one of the data control units to the other, and the other signal line is used such that one of the data control units receives the data from the other.

In a write operation (also referred to as a program operation), a read operation, and a program verify operation (also referred to as a verify operation), the bit line connected to the sense amplifier unit 4a is selected while one word line is selected. The write operation or the read operation is concurrently performed by applying the write voltage or the read voltage to all the memory cells MC connected to the selected word line.

[1-1. Configuration of Sense Amplifier Unit 4a]

Figure 3:
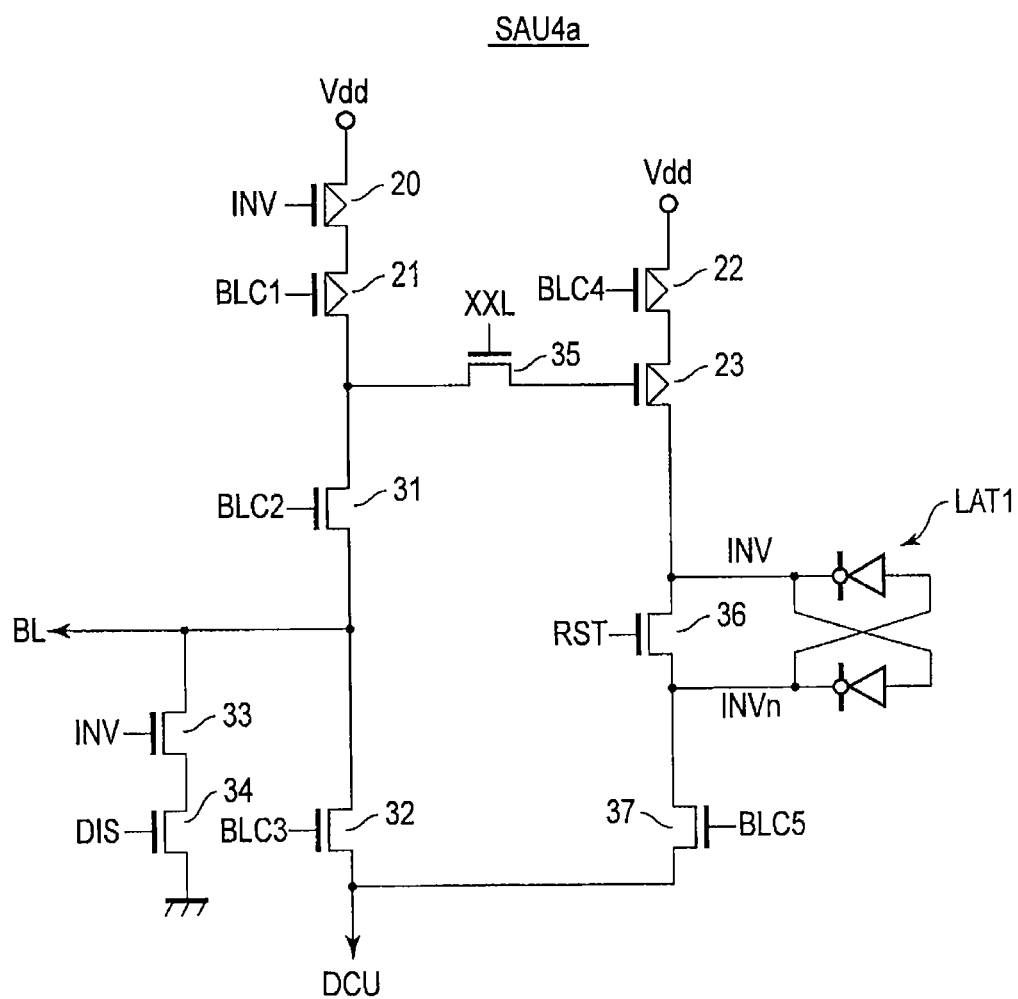

FIG. 3 is a circuit diagram illustrating an example of the sense amplifier unit (SAU) 4a. The sense amplifier unit 4a includes plural P-channel MOS transistors (hereinafter referred to as PMOS transistors) 20, 21, 22, and 23, plural N-channel MOS transistors (hereinafter referred to as NMOS transistors) 31, 32, 33, 34, 35, 36, and 37, and a latch circuit LAT1 that is realized by two clocked inverters.

The source of PMOS transistor 20 is connected to a node to which a power supply voltage Vdd is supplied, and the drain is connected to the data control unit (DCU) 4b through PMOS transistor 21 and NMOS transistors 31 and 32. The gate of PMOS transistor 20 is connected to a node INV of latch circuit LAT1. A signal BLC1 is supplied to the gate of PMOS transistor 21, and signals BLC2 and BLC3 are supplied to the gates of NMOS transistors 31 and 32, respectively. A connection node of NMOS transistor 31 and NMOS transistor 32 is connected to the bit line BL, and grounded through NMOS transistors 33 and 34. The gate of NMOS transistor 33 is connected to node INV of latch circuit LAT1, and NMOS transistor 33 is controlled by the data held in latch circuit LAT1. A signal DIS is supplied to the gate of NMOS transistor 34.

The source of PMOS transistor 22 is connected to the node to which the power supply voltage Vdd is supplied, and the drain is connected to the data control unit 4b through PMOS transistor 23 and NMOS transistors 36 and 37. A signal BLC4 is supplied to the gate of PMOS transistor 22, and the gate of PMOS transistor 23 is connected to a connection node INV of PMOS transistor 21 and NMOS transistor 31 through NMOS transistor 35. A signal XXL is supplied to the gate of NMOS transistor 35, and a reset signal RST is supplied to the gate of NMOS transistor 36. A signal BLC5 is supplied to the gate of NMOS transistor 37. Latch circuit LAT1 is connected in parallel with NMOS transistor 36.

An operation of the sense amplifier unit 4a having the above configuration will schematically be described.

(Write Operation)

When the data is written to the memory cell, the reset signal RST is temporarily made high to reset latch circuit LAT1. That is, node INV of latch circuit LAT1 is made low. Then signals BLC1, BLC4, and DIS are made low.

Then signals BLC2, BLC3, and XXL are made high, and signal BLC4 is made low to take in the data from the data control unit 4b. When the data is low (logical 0) indicating a write, the gate of PMOS transistor 23 goes low to turn on PMOS transistor 23. Therefore, latch circuit LAT1 is made high (logical 1). When the data is high (logical 1) indicating non-write, PMOS transistor 23 turns off. Therefore, latch circuit LAT1 is made low (logical 0). That is, node INV of latch circuit LAT1 is made high when the data is written, and node INV is made low when the data is not written.

Then signals BLC1, BLC3, DIS, and XXL are made low, and signal BLC2 is made high to charge the bit line BL to high. Then signal DIS is made high. Therefore, when node INV of latch circuit LAT1 is high, indicating a write, NMOS transistor 33 turns on to discharge the bit line through NMOS transistors 33 and 34. When node INV of latch circuit LAT1 is low, indicating a non-write, NMOS transistor 33 turns off to keep the bit line in high.

When the select gate line SGD of the select gate transistor ST1 that connects the bit line and the NAND string in FIG. 2 is made high, the potential at the bit line is transferred to a channel of the memory cell. At the same time, a write voltage Vpgm is applied to the word line of the selected memory cell. For the write cell, the channel goes low (Vss), and the write voltage Vpgm is applied to the word line, thereby performing the write operation. For the non-write cell, the channel goes high (=Vdd−Vt, Vt being the threshold voltage of the select gate transistor), and the write voltage Vpgm is applied to the word line. Therefore, the write operation is not performed (write inhibit) because a potential difference between the word line and the channel is insufficiently increased.

(Read Operation)

When the data is read from the memory cell, the reset signal RST is temporarily made high to reset latch circuit LAT1. Then signals BLC1, BLC3, DIS, and XXL are made low, and signal BLC2 is made high to charge the bit line to high. Then signal BLC2 is made low to apply the read voltage to the selected word line. When the threshold voltage of the memory cell is greater than the read voltage, the memory cell turns off to keep the bit line in high. When the threshold voltage of the memory cell is less than the read voltage, the memory cell turns on to discharge the bit line. Therefore, the bit line goes low. Then signal BLC3 is made high, and the data control unit 4b reads the potential at the bit line.

(Program Verify Operation)

After the write operation, the program verify operation is performed to verify the threshold voltage of the memory cell. The program verify operation is substantially identical to the read operation. In the program verify operation, a verification voltage is applied to the selected word line after the bit line is charged to high. When the threshold voltage of the memory cell reaches the verification voltage, because the memory cell turns off, the potential at the bit line is kept high. When the threshold voltage of the memory cell does not reach the verification voltage, because the memory cell is turned on, the potential at the bit line goes low.

At this point, signals BLC1, BLC2, and XXL are made high, and signals BLC4, BLC3, DIS, and RST are made low, whereby latch circuit LAT1 keeps the potential at the bit line BL. That is, the threshold voltage of the memory cell reaches the verification voltage, and the potential at the bit line BL is high, thereby turning off PMOS transistor 23. Therefore, latch circuit LAT1 stays low. PMOS transistor 23 is turned on, when the potential at the bit line BL is high while the threshold voltage of the memory cell does not reach the verification voltage. Therefore, latch circuit LAT1 keeps the high. That is, the potential at node INV of latch circuit LAT1 goes low when the verification is successfully passed, and the potential at node INV goes high when the verification is not passed.

The data of an inverting node INVn of latch circuit LAT1 is transferred to the data control unit 4b, when NMOS transistor 37 is on while signal BLC5 is made high.

[1-2. Configuration of Data Control Unit 4b]

Figure 4:
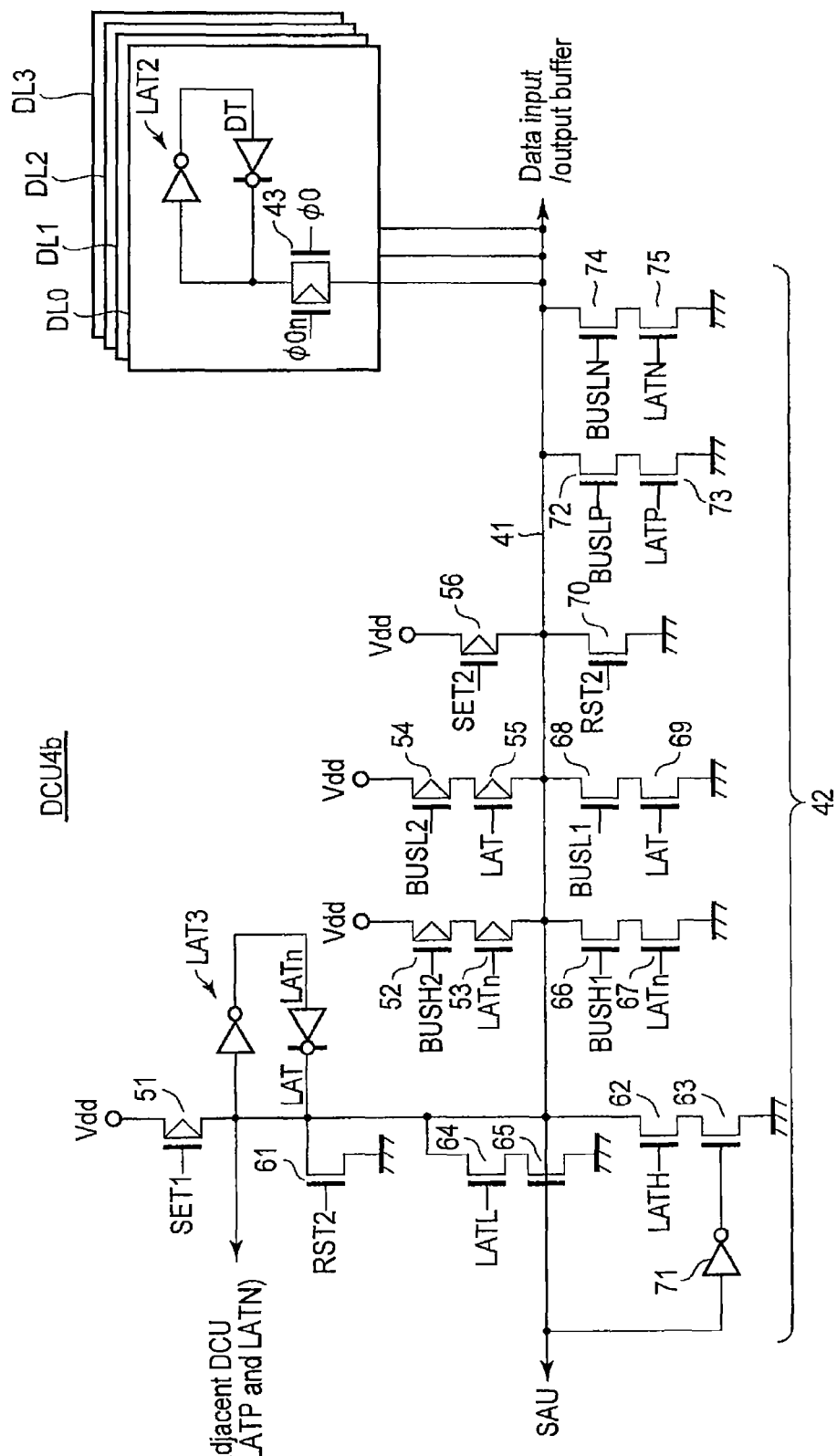

FIG. 4 is a circuit diagram illustrating an example of the data control unit (DCU) 4b. For example, the data control unit 4b includes four data latch circuits DL0 to DL3, a bus 41, and a data forming circuit 42.

One end of the bus 41 is connected to the corresponding sense amplifier unit 4a, and the other end is connected to the data input/output buffer 7.

Data latch circuit DL0 includes a latch circuit LAT2 and a transfer gate 43. Latch circuit LAT2 is connected to the bus 41 through the transfer gate 43. The transfer gate 43 is controlled by a signal φ and its inverted signal φn. Data latch circuits DL1 to DL3 have the same configuration as data latch circuit DL0, and data latch circuits DL0 to DL3 differ from one another in a signal supplied to the transfer gate. Accordingly, data latch circuits DL0 to DL3 can selectively be connected to the bus 41.

The data forming circuit 42 includes a latch circuit LAT3, PMOS transistors 52 to 56, NMOS transistors 61 to 70, an inverter 71, and NMOS transistors 72 to 75. A source of a PMOS 51 is connected to the node to which the power supply voltage Vdd is supplied. A set signal SET1 is supplied to the gate of PMOS transistor 51, and the drain of PMOS transistor 51 is connected to latch circuit LAT3. The drain of PMOS transistor 51 is also grounded through NMOS transistor 61 and NMOS transistors 62 and 63. A reset signal RST2 is supplied to the gate of NMOS transistor 61, and a signal LATH is supplied to the gate of NMOS transistor 62. The gate of NMOS transistor 63 is connected to an output terminal of the inverter 71 in which an input terminal is connected to the bus 41. The drain of PMOS transistor 51 is grounded through NMOS transistors 64 and 65. A signal LATL is supplied to the gate of NMOS transistor 64, and the gate of NMOS transistor 65 is connected to the bus 41.

A series circuit of PMOS transistors 52 and 53, a series circuit of PMOS transistors 54 and 55, and PMOS transistor 56 are connected between the node to which the power supply voltage Vdd is supplied and the bus 41.

A signal BUSH2 is supplied to the gate of PMOS transistor 52, and the gate of PMOS transistor 53 is connected to a node LATn of latch circuit LAT3. PMOS transistors 52 and 53 charge the bus 41 to high according to signal BUSH2 and the potential at node LATn of latch circuit LAT3.

A signal BUSL2 is supplied to the gate of PMOS transistor 54, and the gate of PMOS transistor 55 is connected to a node LAT of latch circuit LAT3. PMOS transistors 54 and 55 charge the bus 41 to high according to signal BUSL2 and the potential at node LAT of latch circuit LAT3.

A set signal SET2 is supplied to the gate of PMOS transistor 56. PMOS transistor 56 charges the bus 41 to high according to the set signal SET2.

A series circuit of NMOS transistors 66 and 67, a series circuit of NMOS transistors 68 and 69, and NMOS transistor 70 are connected between the bus 41 and the ground.

A signal BUSH1 is supplied to the gate of NMOS transistor 66, and the gate of NMOS transistor 67 is connected to node LATn of latch circuit LAT3. NMOS transistors 66 and 67 discharge the bus 41 to low according to signal BUSH1 and the potential at node LATn of latch circuit LAT3.

A signal BUSL1 is supplied to the gate of NMOS transistor 68, and the gate of NMOS transistor 69 is connected to node LAT of latch circuit LAT3. NMOS transistors 68 and 69 discharge the bus 41 to low according to signal BUSL1 and the potential at node LAT of latch circuit LAT3.

The reset signal RST2 is supplied to the gate of NMOS transistor 70. NMOS transistor 70 discharges the bus 41 to low according to the reset signal RST2.

A series circuit of NMOS transistors 72 and 73 and a series circuit of NMOS transistors 74 and 75 are connected between the bus 41 and the ground.

A signal BUSLP is supplied to the gate of NMOS transistor 72, and the gate of NMOS transistor 73 is connected to a node LATP (node LAT of latch circuit LAT3 included in the data control unit adjacent on the left in the row direction of the data control unit). NMOS transistors 72 and 73 discharge the bus 41 to low according to signal BUSLP and the potential at node LATP.

A signal BUSLN is supplied to the gate of NMOS transistor 74, and the gate of NMOS transistor 75 is connected to s node LATN (node LAT of latch circuit LAT3 included in the data control unit adjacent on the right in the row direction of the data control unit). NMOS transistors 74 and 75 discharge the bus 41 to low according to signal BUSLN and the potential at node LATN.

The data control unit 4b can store the data in data latch circuits DL0 to DL3, and calculate the stored data. That is, as described later, the data control unit 4b is configured to obtain AND, NAND, OR, and the inverse of the stored data.

(Basic Operation of Data Control Unit)

A basic operation of the data control unit 4b will be described. The two-bit write data supplied from the data input/output buffer 7 is latched bit by bit by data latch circuits DL0 and DL1. At this point, for example, data latch circuits DL0 and DL1 store lower page data and upper page data, respectively. Data latch circuit DL2 is used to store flag data indicating that the verification is successfully passed. Data latch circuit DL3 is used to store the data transferred from the adjacent data control unit. The stored data of data latch circuits DL0 to DL3 can be transferred to the bus 41 through the transfer gate 43.

When the data of the bus 41 is taken in latch circuit LAT3, the reset signal RST2 is made high to turn on NMOS transistors 61 and 70, thereby resetting the bus 41 and latch circuit LAT3 to low.

Then the set signal SET1 is made low to turn on PMOS transistor 51, and latch circuit LAT3 is made high. Thus, at first latch circuit LAT3 is made high when the data is taken in latch circuit LAT3. Then the data is transferred to the bus 41 by one of data latch circuits DL0 to DL3. At this point, signal LATH is made high. When the bus 41 is high, the output signal of the inverter 71 goes low to keep NMOS transistor 63 in the off state. Therefore, latch circuit LAT3 stays high.

When the bus 41 is low, the output signal of the inverter 71 goes high to turn on NMOS transistor 63. Therefore, latch circuit LAT3 is discharged through NMOS transistors 62 and 63 to go low.

An operation when the data in the bus 41 is inverted and taken in latch circuit LAT3 will be described below. The data is transferred to the bus 41 while latch circuit LAT3 is made high in the above way. Then, signal LATL is made high and signal LATH is made low. When the data in the bus 41 is high, NMOS transistor 65 is turned on. Therefore, latch circuit LAT3 is discharged through NMOS transistors 64 and 65 to go low.

When the bus 41 is low, NMOS transistor 65 remains in the off state. Therefore, latch circuit LAT3 remains high.

The stored data of data latch circuits DL0 to DL3 can be manipulated by transferring the stored data in latch circuit LAT3 to data latch circuits DL0 to DL3.

(Operation to Invert Data Stored in Data Latch Circuit)

An operation to invert the stored data of data latch circuits DL0 to DL3 will be described. The bus 41 is charged by the above operation to open one of the transfer gates 43 of data latch circuits DL0 to DL3. For example, assuming that the transfer gate 43 of data latch circuit DL0 is opened, when node DT of data latch circuit DL0 is high, the bus 41 is discharged through the clocked inverter of data latch circuit DL0, and the inverted data of node DT is transferred to the bus 41.

After latch circuit LAT3 is reset in the above way, signal SET1 is made low, and node LAT of latch circuit LAT3 is made high.

When signal LATL is made high, node LAT goes high when the bus 41 is discharged by the data of data latch circuit DL0, and NMOS transistor 65 is turned on when the bus 41 is kept in the charge state. Therefore, node LAT is discharged to low.

As described above, when the bus 41 is charged while signal BUSH1 is made high, the bus 41 is kept high when node LAT is high (node LATn of latch circuit LAT3 is low), and the bus 41 goes low when node LAT is low (node LATn of latch circuit LAT3 is high).

After latch circuit LAT2 of data latch circuit DL0 is reset, the data in the bus 41 is taken in latch circuit LAT2 through the transfer gate 43 by opening the transfer gate 43. As a result, node DT goes low when the bus 41 is high, and node DT goes high when the bus 41 is low.

The above sequence of operations is summarized as follows. The inverted data in node DT of latch circuit LAT2 is transferred to the bus 41, and data in which the inverted data is further inverted is transferred to latch circuit LAT3. The data stored in latch circuit LAT3 is transferred to the bus 41, and the inverted data of the bus 41 is stored in node DT of latch circuit LTA2. Thus, nodes DT of data latch circuits DL0 to DL3 are inverted.

The basic operation of the data control unit 4b is not limited to the first embodiment. The basic operation may be performed in a different way. The AND, NAND, and OR operations can be performed on the data based on the operation.

(Operation to Transfer Data Between Adjacent Data Control Units)

As illustrated in FIG. 2, the data control unit 4b is connected to the data control unit that is adjacent in the row direction, and configured to be able to send and receive the data to and from the data control unit that is adjacent to the data control unit 4b in the row direction. The data control unit 4b (specifically, data forming circuit 42) includes NMOS transistors 72 to 75 in order to perform the data transfer operation.

As described above, when the bus 41 is charged while signal BUSLP is made high, the bus 41 is kept high when node LATP is low, and the bus 41 goes low when node LATP is high. The inverted data of latch circuit LAT3 included in the data control unit that is adjacent on the left of the data control unit can be transferred to the bus 41 by the operation. Then data latch circuit DL3 stores the data of the bus 41.

Similarly, as described above, when the bus 41 is charged while signal BUSLN is made high, the bus 41 is kept high when node LATN is low, and the bus 41 goes low when node LATN is high. The inverted data of latch circuit LAT3 included in the data control unit that is adjacent on the right of the data control unit can be transferred to the bus 41 by the operation. Then data latch circuit DL3 holds the data of the bus 41.

[2. Operation of Nonvolatile Semiconductor Memory Device]

An operation of the nonvolatile semiconductor memory device 1 having the above configuration will be described below. The memory cell MC of the first embodiment can store the data of at least two bits (or three values, for example, at least three threshold distributions) in one memory cell MC. The case that the two-bit data is stored in the memory cell MC will be described by way of example.

FIGS. 5A and 5B are views illustrating a relationship between the threshold voltage of the memory cell MC and the data. The two-bit data is expressed by "xy" of upper page data x and lower page data y. For example, the data is allocated according to the threshold distribution such that an Er level is set to "11", an A level is set to "01", a B level is set to "00", and a C level is set to "10". The two-time data write (program), namely, a lower page program and a upper page program are required for the two-bit data storage system.

The Er level is an erase state (for example, negative threshold voltage) having the lowest threshold voltage of the memory cell. FIG. 5A illustrates the threshold distribution of the memory cell when a lower page is programmed, and a threshold voltage Vth of the memory cell is set to one of the Er level and an LM (Lower Middle) level. The lower page program is an operation to selectively set the memory cell at the Er level to the LM level. The memory cell at the LM level is one in which the lower page program is data 0.

FIG. 5B illustrates the threshold distribution of the memory cell when an upper page is programmed. The upper page program includes a first upper page program that selectively sets the memory cell at the Er level to the A level and a second upper page program that selectively sets the memory cell at the LM level to the B level and the C level. In the two kinds of the upper page programs, the data 0 and data 1 are selectively provided to the selected page to simultaneously apply a program voltage in one write sequence.

Figure 6A:
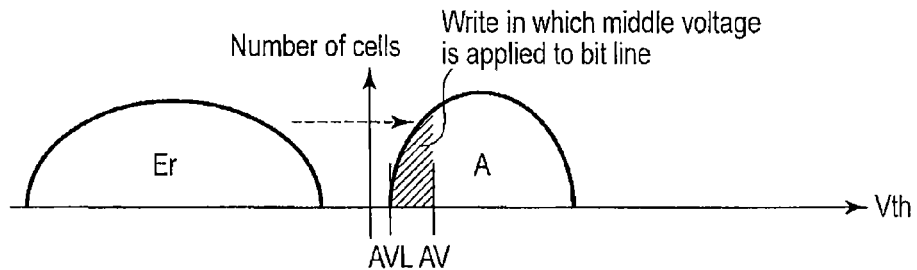
Figure 6B:
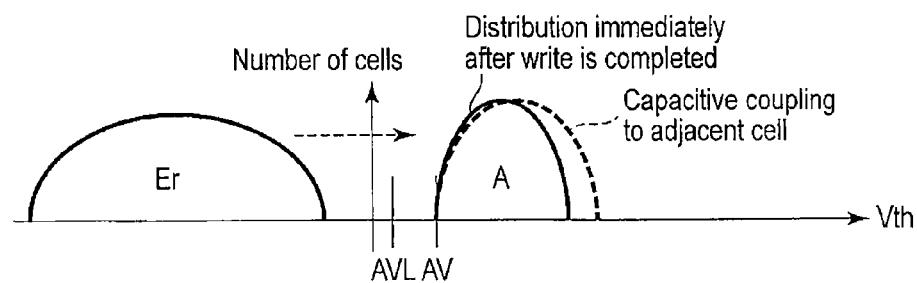

FIGS. 6A and 6B are schematic diagrams illustrating an example of the write operation. A step of applying the write voltage to the word line to increase the threshold voltage of the memory cell and a step of verifying the threshold voltage of the memory cell are repeatedly performed in the write operation. When all the memory cells (or at least the predetermined number of memory cells) of the selected page connected to the word line pass the verify operation, the write operation of the word line is completed, and the write operation is performed on the next word line. In the block BLK, for example, the write operation is sequentially performed from the word line WL closest to the source line SRC.

As illustrated in FIG. 6A, when the write operation is performed on the memory cell at the A level, a verification voltage AV at which an A-level verify operation is passed and a verification voltage AVL (greater than the Er level) that is slightly less than verification voltage AV are prepared, and the verify operation is performed in two batches. In the write voltage applying operation, a middle voltage between zero and the power supply voltage Vdd is applied to the memory cell having the threshold voltage, which is greater than or equal to verification voltage AVL and less than verification voltage AV in the verify operation. Therefore, a variation amount (increase amount) of the threshold voltage can be reduced compared with the case that 0 V is applied to the bit line. As a result, as illustrated in FIG. 6B, the threshold voltage distribution can be finely divided.

However, even in the finer distribution obtained by the above method, when the write operation is performed on the adjacent cell at the threshold voltage greater than the A level, the threshold distribution is influenced by the capacitive coupling in a procedure of the write operation. Consequently, the resultant distribution is widened as illustrated by a broken line of FIG. 6B.

Therefore, in the first embodiment, when the write data of an adjacent cell that is adjacent in the row direction of an attention cell to which the A-level write operation is performed has the threshold voltage (B and C levels) greater than the A level, the verification voltage of the attention cell is set greater than or equal to verification voltage AVL and less than verification voltage AV. Therefore, even if the threshold voltage of the attention cell is shifted by the capacitive coupling with the adjacent cell, the threshold distribution of the A-level memory cell can be prevented from being widened.

Figure 7A:
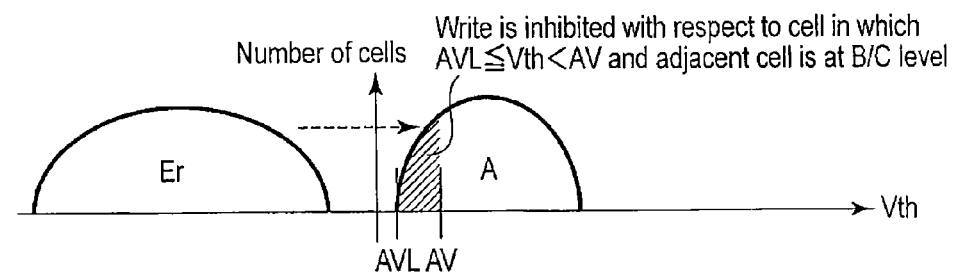
Figure 7B:
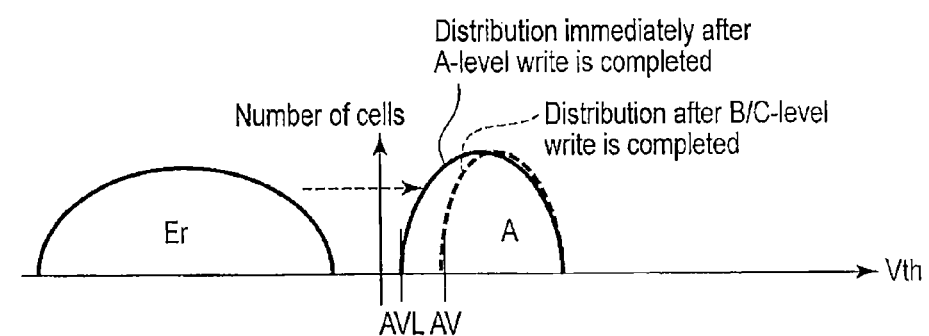

FIGS. 7A and 7B are schematic diagrams illustrating the write operation of the first embodiment. As illustrated in FIG. 7A, the verify operation is performed using verification voltages AVL and AV, and attention is paid to a group (first group) of the memory cells having the threshold voltages that are greater than or equal to verification voltage AVL and less than verification voltage AV. The first group is further divided into two groups based on the data (adjacent data) of the adjacent cell that is adjacent to the attention cell. That is, whether the attention cell having the threshold voltage that is greater than or equal to verification voltage AVL and less than verification voltage AV includes the adjacent data at the B or C level (B/C level) is checked.

In the verify operation after the application of the write voltage, when the attention cell having the threshold voltage that is greater than or equal to verification voltage AVL and less than verification voltage AV includes the adjacent data at the B or C level, the write operation is completed (inhibited) on the attention cell. On the other hand, when the attention cell having the threshold voltage that is greater than or equal to verification voltage AVL and less than verification voltage AV does not include the adjacent data at the B or C level, a middle voltage is applied to the bit line with respect to the attention cell from the next write voltage applying operation. The A-level threshold distribution in which the write operation is completed by the above method is illustrated by a solid line in FIG. 7B. Then, because the write operation is performed on the memory cell at the B and C levels, the memory cell having the threshold voltage that is greater than or equal to verification voltage AVL and less than verification voltage AV is influenced by the capacitive coupling to become the broken-line distribution. As a result, the threshold distribution of the memory cell at the A level becomes thinner compared with the case that the A-level write operation is completed.

Figures 8, 9:
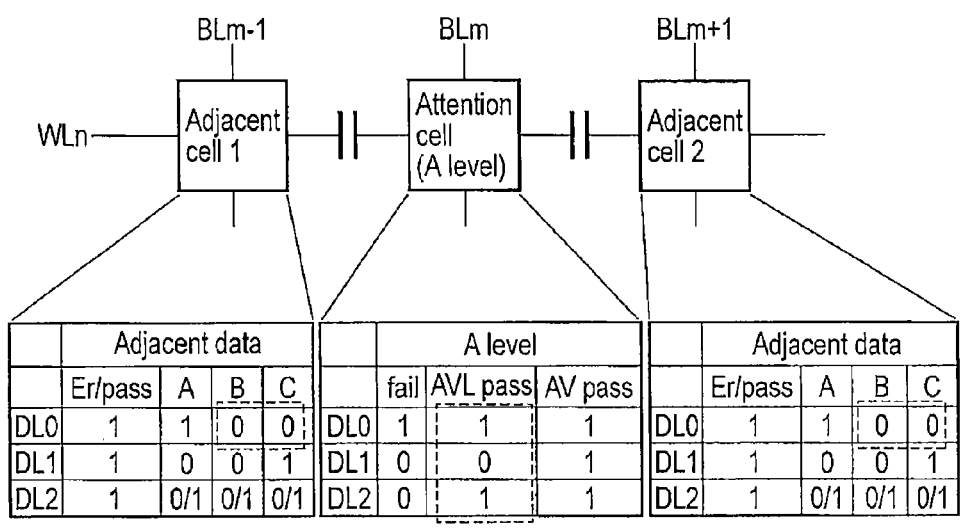

A control method for determining whether the attention cell has the threshold voltage that is greater than or equal to verification voltage AVL and less than verification voltage AV and whether the attention cell includes the adjacent data at the B or C level will be described below. FIG. 8 is a view illustrating data allocations of data latch circuits DL0 to DL2.

The lower page data of the two-bit write data is stored in data latch circuit DL0. The upper page data of the two-bit write data is stored in data latch circuit DL1. The data indicating whether the verification has passed or failed as a verification result for the lower verification voltage (corresponds to verification voltage AVL in the case of the A level), is stored in data latch circuit DL2. The data indicating that the verification has passed is set to data 1, and the data indicating that the verification has failed is set to data 0. In the memory cell (including the memory cell in which the verification of verification voltage AV has passed) in which the write operation is completed, the items of data of data latch circuits DL1 and DL2 are set to 111.

FIG. 9 is a view illustrating data states of data latch circuits DL0 to DL2 relating to the attention cell and the adjacent cells. The attention cell is any memory cell that is included in the selected page connected to the selected word line WLn, and one in which the data is written at the A level. The adjacent cell 1 is a memory cell, which is connected to the selected word line WLn and adjacent on the left of the attention cell. The adjacent cell 2 is a memory cell, which is connected to the selected word line WLn and adjacent on the right of the attention cell. The adjacent cell 1, the attention cell, and the adjacent cell 2 are connected to the bit lines BLm−1, BLm, and BLm+1, respectively. One attention cell is illustrated in the example in FIG. 9. However, because the adjacent cell is dealt with as the attention cell, actually the computation is performed twice while divided into a computation for even cells and a computation for odd cells.

The computation for the odd cell will be described. The computation for the odd cell is performed by the following expression. In the expression, "odd" indicates the data latch circuit of the attention cell, "even 1" indicates the data latch circuit of the adjacent cell 1, and "even 2" indicates the data latch circuit of the adjacent cell 2. The symbol "~" means inversion, "|" means logical addition OR, "&" means logical product AND, and "→" means the operation to store the data.

(~DL0(even 1)|~DL0(even 2))&DL0(odd)&~DL1(odd)&DL2(odd)|DL1(odd)→DL1(odd)

Specifically, the inverted data of data latch circuit DL0 of the adjacent cell is used to determine that the write data of the adjacent cell (adjacent cell 1 or adjacent cell 2) is at the B or C level. When the logical addition of the items of inverted data of data latch circuits DL0 of the adjacent cells 1 and 2 is 1, it is found that the data is written to at least one of the adjacent cells 1 and 2 at the B or C level.

Then a calculation of DL0&~DL1&DL2 is performed to the attention cell in order to determine that the attention cell is the memory cell in which the data is written at the A level and has the threshold voltage that is greater than or equal to verification voltage AVL and less than verification voltage AV as the verification result. When the result of the logical product of the expression of (~DL0(even 1)|~DL0(even 2))&DL0(odd)&~DL1(odd)&DL2(odd)|DL1(odd)→DL1(odd) and the calculation of DL0&~DL1&DL2 is 1, it can be determined that the attention cell is the memory cell in which the data is written at the A level and has the threshold voltage that is greater than or equal to verification voltage AVL and less than verification voltage AV as the verification result, and that the data is written to one of the adjacent cells 1 and 2 at the B or C level. At this point, in order to determine that the attention cell passes the verification, the result of the logical product with data latch circuit DL1 of the attention cell is substituted for data latch circuit DL1 of the attention cell. Therefore, data latch circuits DL0 to DL2 of the attention cell become 111, the write operation to the attention cell is completed, and subsequent write operation to the attention cell is inhibited.

Then the same calculation as the odd cell is performed to the even cell. The calculation for the even cell is performed by the following expression.

(~DL0(odd 1)|~DL0(odd 2))&DL0(even)&~DL1(even)&DL2(even)|DL1(even)→DL1(even)

The preparation of the next write operation is completed by the calculation. Then the write operation (application of the write voltage) is performed based on the data of the data latch circuit.

The state in which the above calculation result becomes 1, namely, the state in which the condition that "the data is written to the attention cell at the A level and the data is written to at least one of the adjacent cells 1 and 2 at the B or C level" is satisfied, the attention cell, the adjacent cell 1, and the adjacent cell 2 become the following data patterns. A notation of "(adjacent cell 1)-(attention cell)-(adjacent cell 2)" indicates write data (Er, A, B, and C).

(Data Pattern Including Adjacent Cell at C Level)
Seven data patterns of C-A-C, C-A-B, C-A-A, C-A-Er, B-A-C, A-A-C, and Er-A-C (Data Pattern including Adjacent Cell at B Level or Less)
Five data patterns of B-A-B, B-A-A, B-A-Er, A-A-B, and Er-A-B The write operation to the attention cell is completed in the case of the above data patterns, and when the verification voltage of the attention cell is greater than or equal to verification voltage AVL and less than verification voltage AV.

Figure 10:
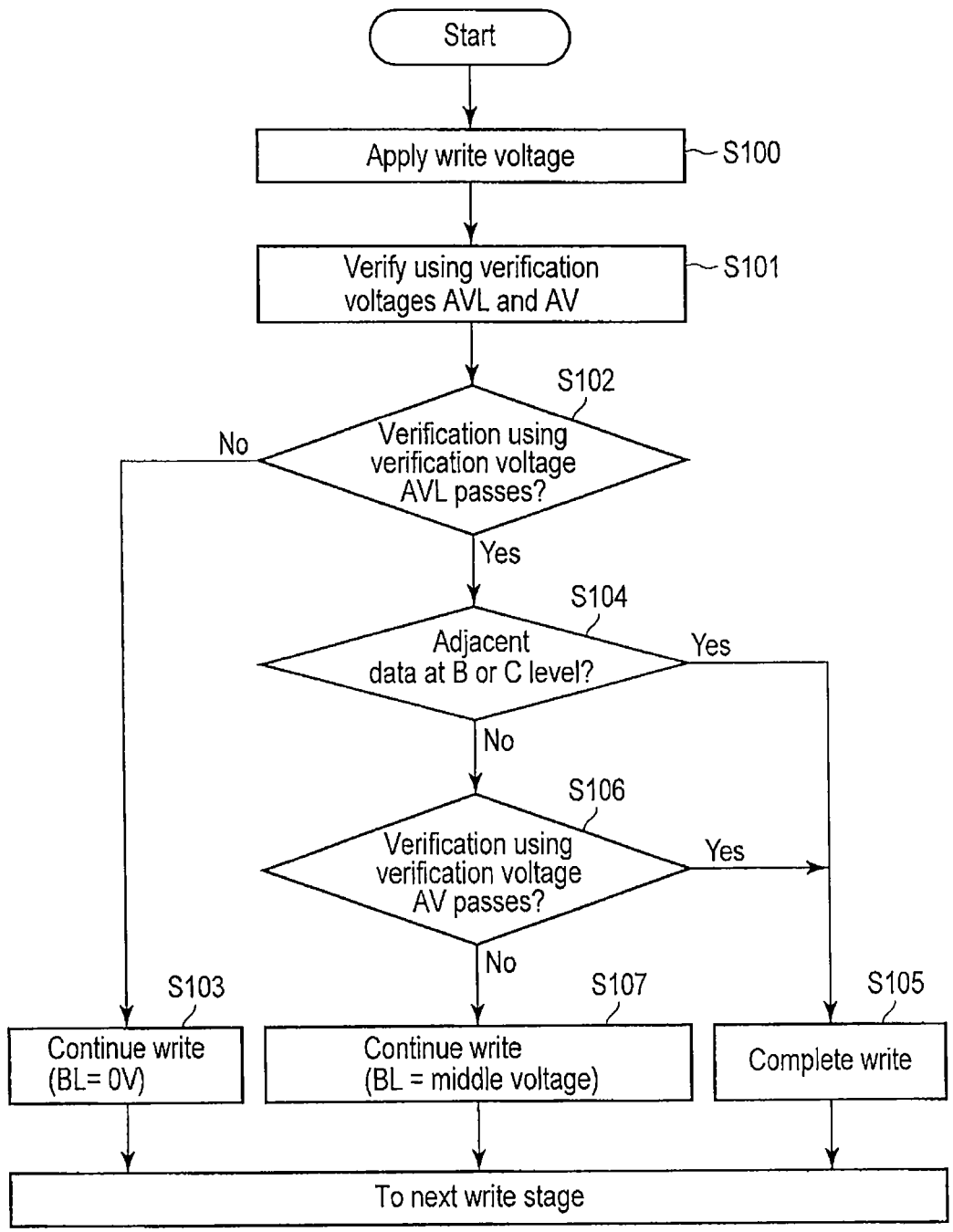

FIG. 10 is a flowchart illustrating the write operation of the first embodiment. FIG. 10 illustrates the write operation to the attention cell, and therefore the write operation in FIG. 10 is performed to all the memory cells in the selected page.

After the sense amplifier 4 sets the voltage at the bit line according to the write data and the previous verification result, the word line controller 3 applies the write voltage to the selected word line in order to write the data at the A level (Step S100). Then the sense amplifier 4 and the word line controller 3 performs the verify operation using verification voltages AVL and AV (Step S101).

When the attention cell fails in the verify operation using verification voltage AVL in Step S102, the write operation to the attention cell is continued (Step S103). That is, the sense amplifier 4 sets the data of the data latch circuit such that the write operation to the attention cell is continued while the voltage at the bit line is set to zero.

When the attention cell passes the verify operation using verification voltage AVL in Step S102, the controller 9 determines whether the adjacent data of at least one of the adjacent cells 1 and 2 adjacent on both the sides of the attention cell is at the B or C level (Step S104). When the adjacent data is at the B or C level in Step S104, the write operation to the attention cell is completed (Step S105). That is, the sense amplifier 4 sets the data of the data latch circuit such that the write operation to the attention cell is inhibited.

When the adjacent data is not at the B or C level in Step S104, the controller 9 determines whether the attention cell passes the verify operation using verification voltage AV (Step S106). When the attention cell passes the verification using verification voltage AV in Step S106, the write operation to the attention cell is completed (Step S105). That is, the sense amplifier 4 sets the data of the data latch circuit such that the write operation to the attention cell is inhibited.

When the attention cell fails in the verify operation using verification voltage AV in Step S106, because the adjacent data is not at the B or C level, the write operation to the attention cell is continued (Step S107). That is, the sense amplifier 4 sets the data of the data latch circuit such that the write operation to the attention cell is continued while the voltage at the bit line is set to the middle voltage.

After the above control is performed to all the memory cells included in the selected page, the current write stage (application of the write voltage and the verify operation) is ended. The next write stage is performed using the write voltage to which the step-up voltage is added.

FIG. 11 is a view illustrating a relationship between the threshold voltage of the memory cell and the data stored in the data latch circuit after the A-level write verification. In the first embodiment, the write state of the memory cell is classified into four patterns after the verify operation of A-level, namely, after the verify operation is performed using verification voltages AVL and AV.

In a first pattern, when the attention cell does not pass the verify operation using verification voltages AVL and AV, namely, when the threshold voltage Vth of the memory cell is less than verification voltage AVL, the normal write operation is continuously performed while the bit line is set to zero. At this point, the data stored in data latch circuits DL0 to DL2 is 100.

When the attention cell passes the verify operation using verification voltage AVL while failing in the verify operation using verification voltage AV, namely, when the threshold voltage Vth of the memory cell is less than verification voltage AV, the write state is determined after the data of the adjacent cell is checked. Specifically, when the threshold voltage Vth of the memory cell is greater than or equal to verification voltage AVL and less than verification voltage AV, and when the write data of the adjacent cell is at the Er or A level, the write operation is continuously performed while the bit line is set to the middle voltage (second pattern). At this point, the data Stored in data latch circuits DL0 to DL2 is 101. On the other hand, when the threshold voltage Vth of the memory cell is greater than or equal to verification voltage AVL and less than verification voltage AV, and when the write data of the adjacent cell is at the B or C level, the write operation to the memory cell is inhibited (third pattern). At this point, the data of data latch circuits DL0 to DL2 is 111.

In a fourth pattern, when the attention cell passes both the verify operation using verification voltages AVL and AV, namely, when the threshold voltage Vth of the memory cell is greater than or equal to verification voltage AV, the write operation to the memory cell is inhibited. At this point, the data of data latch circuits DL0 to DL2 is 111.

[3. Effect]

As described in detail above, in the first embodiment, the nonvolatile semiconductor memory device 1 includes the memory cell array 2 and the controller 9. The memory cell array 2 is connected to the plural word lines and the plural bit lines, and includes the plural memory cells in each of which n values (n is natural numbers of 3 or more) can be stored. The controller 9 controls the voltages at the word line and the bit line according to the write data, and performs the write operation to write the data to the memory cell and the verify operation to verify the threshold voltage of the memory cell. The controller 9 performs the verify operation using verification voltages AVL and AV (AVL<AV) when the write operation is performed on the attention cell at the A level. The controller 9 completes the write operation to the attention cell when the threshold voltage of the attention cell is greater than or equal to verification voltage AVL and less than verification voltage AV, and when the data is written to the adjacent cell adjacent to the attention cell at the threshold voltage (B or C level) greater than the A level.

According to the first embodiment, even if the threshold voltage of the attention cell is shifted from the threshold voltage immediately after the write operation due to the capacitive coupling with the adjacent cell, the threshold distribution of the A-level memory cell can be prevented from being widened. Therefore, the threshold distribution of the memory cell can be narrowed. As a result, the data of the memory cell is correctly read, so that the nonvolatile semiconductor memory device 1 that can reduce the erroneous read can be realized.

In the first embodiment, because the threshold variation can be compensated according to the data patterns of the adjacent cells, the threshold distribution of the memory cell can be narrowed even if the memory cell is more shrunk.

When the attention cell is the memory cell in which the data is written at the A level, when the threshold voltage of the attention cell is greater than or equal to verification voltage AVL and less than verification voltage AV, and when the data is written to the adjacent cell adjacent to the attention cell at the threshold voltage (Er or A level) less than or equal to the A level, the controller 9 performs the write operation by applying the middle voltage between the ground voltage Vss and the power supply voltage Vdd to the bit line. Therefore, the increase of the threshold voltage of the attention cell is reduced, so that the threshold distribution of the memory cell can be narrowed.

[Second Embodiment]

The shift amount of the threshold voltage of the memory cell (attention cell) is increased with increasing threshold voltage difference between the attention cell and the adjacent cell. When the data is written to the attention cell at the A level while written to the adjacent cell at the C level, the shift amount of the threshold voltage of the attention cell is increased compared with the case that the data is written to the adjacent cell at the B level. Therefore, in a second embodiment, when the threshold voltage Vth of the attention cell is greater than or equal to verification voltage AVL and less than verification voltage AV, and when the data is written to the adjacent cell at the C level (the highest state of the threshold voltage), the write operation to the attention cell is completed.

Figure 12:
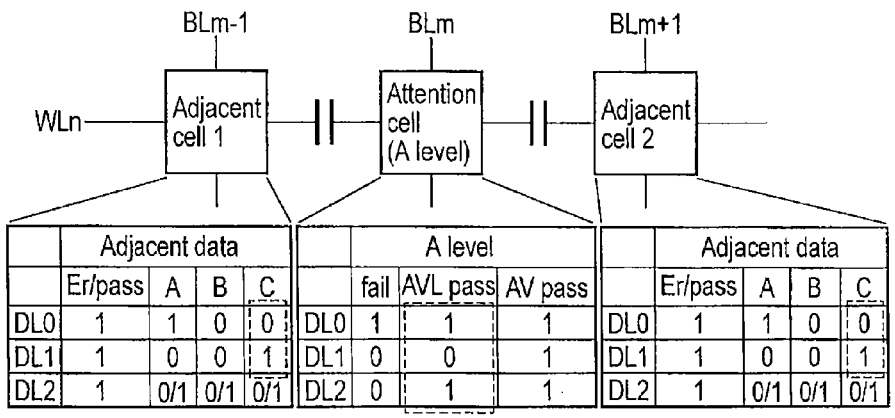

FIG. 12 is a view illustrating the data states of data latch circuits DL0 to DL2 relating to the attention cell and the adjacent cells. One attention cell is illustrated in the example in FIG. 12. However, when the adjacent cell is dealt with as the attention cell, actually the computation is performed twice while divided into the computation for the even cells and the computation for the odd cells.

The computation for the odd cell will be described. The computation for the odd cell is performed by the following expression. In the expression, "odd" indicates the data latch circuit of the attention cell, "even 1" indicates the data latch circuit of the adjacent cell 1, and "even 2" indicates the data latch circuit of the adjacent cell 2.

(~DL0(even 1)&DL1(even 1)|~DL0(even 2)&DL1(even 2))&DL0(odd)&~DL1(odd)&DL2(odd)|DL1(odd)→DL1(odd)

Specifically, the stored data of data latch circuits DL0 and DL1 of the adjacent cell are used to determine that the write data of the adjacent cell (adjacent cell 1 or adjacent cell 2) is at the B or C level. When the logical addition of the inverted data of data latch circuit DL0 of the adjacent cell 1 and the data stored in data latch circuit DL1 of the adjacent cell 1 is 1, it is found that the data is written to the adjacent cell 1 at the C level. Because the same holds true for the adjacent cell 2, when the logical addition of the computation results of the adjacent cells 1 and 2 is 1, it is found that the data is written to at least one of the adjacent cells 1 and 2 at the C level.

Then the calculation of DL0&~DL1&DL2 is performed to the attention cell in order to determine that the attention cell is the memory cell in which the data is written at the A level and has the threshold voltage that is greater than or equal to verification voltage AVL and less than verification voltage AV as the verification result. When the result of the logical product of the expression of (~DL0(even 1)&DL1(even 1)|~DL0(even 2)&DL1(even 2))&DL0(odd)&~DL1(odd)&DL2(odd)|DL1(odd)→DL1(odd) and the calculation of DL0&~DL1&DL2 is 1, it can be determined that the attention cell is the memory cell in which the data is written at the A level and has the threshold voltage that is greater than or equal to verification voltage AVL and less than verification voltage AV as the verification result, and that the data is written to one of the adjacent cells 1 and 2 at the C level. At this point, in order to determine that the attention cell passes the verify operation, the result of the logical product with data latch circuit DL1 of the attention cell is substituted for data latch circuit DL1 of the attention cell. Therefore, data latch circuits DL0 to DL2 of the attention cell become 111, the write operation to the attention cell is completed, and subsequent write operation to the attention cell is inhibited.

Then the same calculation as the odd cell is performed to the even cell. The calculation for the even cell is performed by the following expression.

(~DL0(odd 1)&DL1(odd 1)|~DL0(odd 2)&DL1(odd 2))&DL0(even)&~DL1(even)&DL2(even)|DL1(even)→DL1(even)

The preparation of the next write operation is completed by the calculation. Then the write operation (application of the write voltage) is performed based on the data of the data latch circuit.

The state in which the above calculation result becomes 1, namely, the state in which the condition that "the data is written to the attention cell at the A level and the data is written to at least one of the adjacent cells 1 and 2 at the C level" is satisfied, the attention cell, the adjacent cell 1, and the adjacent cell 2 become the following data patterns. The notation of "(adjacent cell 1)-(attention cell)-(adjacent cell 2)" indicates write data (Er, A, B, and C).

Seven data patterns of C-A-C, C-A-B, C-A-A, C-A-Er, B-A-C, A-A-C, and Er-A-C

The write operation to the attention cell is completed in the case of the above data patters, and when verification voltage of the attention cell is greater than or equal to verification voltage AVL and less than verification voltage AV.

Figure 13:
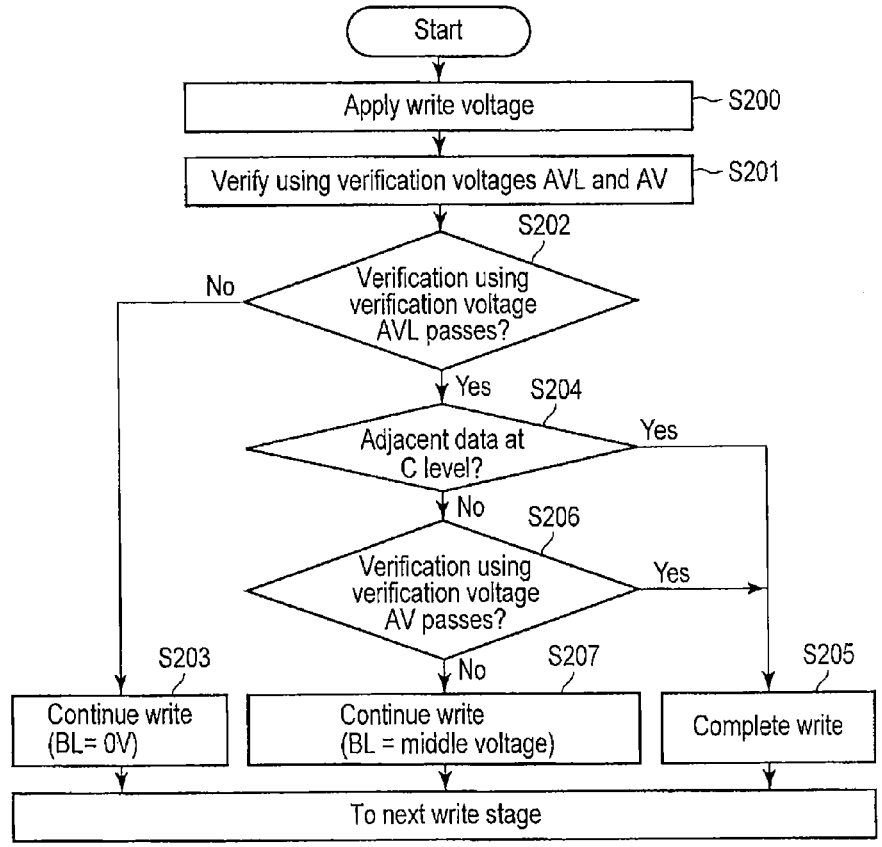

FIG. 13 is a flowchart illustrating a write operation of the second embodiment. FIG. 13 illustrates the write operation to the attention cell, and therefore the write operation in FIG. 13 is performed on all the memory cells in the selected page.

In the write operation of the second embodiment, when the attention cell passes the verify operation using verification voltage AVL in Step S202, the controller 9 determines whether the adjacent data of at least one of the adjacent cells 1 and 2 adjacent on both the sides of the attention cell is at the C level (Step S204). When the adjacent data is at the C level in Step S204, the write operation to the attention cell is completed (Step S205). That is, the sense amplifier 4 sets the data of the data latch circuit such that the write operation to the attention cell is inhibited. Other steps are identical to those of the flowchart in FIG. 10 of the first embodiment.

(Effect)

As described in detail above, according to the second embodiment, when the threshold voltage Vth of the memory cell (attention cell) is greater than or equal to verification voltage AVL and less than verification voltage AV, and when the data is written to the adjacent cell at the C level (the highest state of the threshold voltage), the control can be performed such that the write operation to the attention cell is completed.

Therefore, when the data is written to the adjacent cell, which is adjacent to the attention cell in which the data is written at the A level, at the C level (the highest threshold voltage), the shift amount of the threshold voltage of the attention cell can be reduced. Other effects are identical to those of the first embodiment.

In the first and second embodiments, data of two bits are stored in one memory cell. The first and second embodiments can also be applied to the case that at least three bits are stored in one memory cell. In the first and second embodiments, the data is written to the attention cell at the A level. The first and second embodiments can also be applied to the case that the data is written to the attention cell at the threshold voltage except the A level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array connected to word lines and bit lines, and including memory cells each of which is capable of storing n values (n is a natural number of 3 or more); and
    a controller configured to control voltages at a word line and a bit line according to write data, and to perform a write operation to write data to the memory cell and a verify operation to verify a threshold voltage of the memory cell, wherein
    the controller is configured to perform a verify operation using a first verification voltage and a second verification voltage (first verification voltage<second verification voltage) when first value data is stored in a first memory cell,
    the controller is configured to determine whether a write operation to the first memory cell is completed or continued based on write data of a second memory cell adjacent to the first memory cell when a threshold voltage of the first memory cell is greater than or equal to the first verification voltage and less than the second verification voltage,
    the controller is configured to complete the write operation to the first memory cell when the threshold voltage of the first memory cell is greater than or equal to the first verification voltage and less than the second verification voltage, and when second value data is stored in the second memory cell, and
    a threshold voltage of the second value data is greater than that of the first value data.

2. The device of claim 1, wherein
    the controller is configured to inhibit a write operation to a third memory cell having a threshold voltage greater than or equal to the second verification voltage, and
    the controller is configured to set the first memory cell in which the write operation is completed to a bias identical to that of the third memory cell.

3. The device of claim 1, wherein
the controller is configured to continue the write operation to the first memory cell when the threshold voltage of the first memory cell is greater than or equal to the first verification voltage and less than the second verification voltage, and when third value data is stored in the second memory cell, and
a threshold voltage of the third value data is less than or equal to that of the first threshold voltage.

4. The device of claim 3, wherein
the controller is configured to apply a middle voltage to a bit line connected to the first memory cell when the write operation to the first memory cell is continued, and
the middle voltage is set between a first bit line voltage that is used to write data to a memory cell having a threshold voltage less than the first verification voltage and a second bit line voltage (first bit line voltage<second bit line voltage) that is used to inhibit the write operation to the memory cell.

5. The device of claim 1, wherein the controller is configured to continue the write operation to the first memory cell by applying a ground voltage to a bit line connected to the first memory cell when the threshold voltage of the first memory cell is less than the first verification voltage.

6. The device of claim 1, further comprising a latch circuit storing write data and the verify result of the memory cell,
wherein the controller is configured to operate using the data of the latch circuit.

7. The device of claim 6, wherein a first latch circuit connected to the first memory cell includes a data path to a second latch circuit connected to the second memory cell.

8. The device of claim 1, wherein the first value data has a threshold voltage that is highest next to a threshold voltage in an erase state.

9. A nonvolatile semiconductor memory device comprising:
a memory cell array connected to word lines and bit lines, and including memory cells each of which is capable of storing four values corresponding to first to fourth value data, the first value data corresponding to an erase state; and
a controller configured to control voltages at a word line and a bit line according to write data, and to perform a write operation to write data to the memory cell and a verify operation to verify a threshold voltage of the memory cell, wherein
the controller is configured to perform a verify operation to verify the threshold voltage of a first memory cell using a first verification voltage and a second verification voltage (first verification voltage<second verification voltage) when the second value data is stored in the first memory cell,
the controller is configured to determine whether a write operation of the first memory cell is completed or continued based on write data of a second memory cell adjacent to the first memory cell when a threshold voltage of the first memory cell is greater than or equal to the first verification voltage and less than the second verification voltage,
the controller is configured to complete the write operation to the first memory cell when the threshold voltage of the first memory cell is greater than or equal to the first verification voltage and less than the second verification voltage, and when the fourth value data is stored in the second memory cell, and
the controller is configured to complete the write operation to the first memory cell when the threshold voltage of the first memory cell is greater than or equal to the second verification voltage.

10. The device of claim 9, wherein
the controller is configured to inhibit a write operation to a third memory cell having a threshold voltage greater than or equal to the second verification voltage, and
the controller is configured to set the first memory cell in which the write operation is completed to a bias identical to that of the third memory cell.

11. The device of claim 9, wherein
the controller is configured to continue the write operation to the first memory cell when the threshold voltage of the first memory cell is greater than or equal to the first verification voltage and less than the second verification voltage, and when the first, second, or third value data is stored in the second memory cell.

12. The device of claim 11, wherein
the controller is configured to apply a middle voltage to a bit line connected to the first memory cell when the write operation to the first memory cell is continued, and
the middle voltage is set between a first bit line voltage that is used to write data to a memory cell having a threshold voltage less than the first verification voltage and a second bit line voltage (first bit line voltage<second bit line voltage) that is used to inhibit the write operation to the memory cell.

13. The device of claim 9, wherein the controller is configured to continue the write operation to the first memory cell by applying a ground voltage to a bit line connected to the first memory cell when the threshold voltage of the first memory cell is less than the first verification voltage.

14. The device of claim 9, further comprising a latch circuit storing write data and the verify result of the memory cell,
wherein the controller is configured to operate using the data of the latch circuit.

15. The device of claim 14, wherein a first latch circuit connected to the first memory cell includes a data path to a second latch circuit connected to the second memory cell.

16. The device of claim 14, wherein the second verification voltage is a voltage at which a verify operation for the second value data is passed.

* * * * *